United States Patent [19]
Sakurai

[11] Patent Number: 4,531,232
[45] Date of Patent: Jul. 23, 1985

[54] RADIO RECEIVER APPARATUS FOR VEHICLE

[75] Inventor: Takashi Sakurai, Nagoya, Japan

[73] Assignee: Nippondenso Co., Ltd., Kariya, Japan

[21] Appl. No.: 469,712

[22] Filed: Feb. 25, 1983

[30] Foreign Application Priority Data

Mar. 4, 1982 [JP] Japan .................................. 57-34483
Sep. 9, 1982 [JP] Japan ................................ 57-156973

[51] Int. Cl.³ .............................................. H04B 1/08
[52] U.S. Cl. .................................... 455/152; 343/702;
  343/714; 343/715; 455/345; 455/352
[58] Field of Search ................................. 455/280–282,
  455/345, 152, 352, 353, 254; 343/702, 713, 714, 715

[56] References Cited

U.S. PATENT DOCUMENTS 2,392,665 1/1946 Gustafson ............................ 455/152
2,943,190 6/1960 Birkenes ............................. 455/345
2,973,431 2/1961 Sontheimer .......................... 455/345
3,022,420 2/1962 Brinkerhoff ......................... 343/714
3,987,448 10/1976 Scheppman ......................... 343/702

Primary Examiner—Marc E. Bookbinder
Attorney, Agent, or Firm—Cushman, Darby & Cushman

[57] ABSTRACT

A vehicle radio receiver apparatus constitutes an antenna device including an antenna element and also a radio receiver integral with the antenna device so as to receive a signal from the antenna element. The radio receiver includes a tuner circuit directly connected to the antenna element, a high-frequency amplifier circuit for amplifying the reception signal tuned into by the tuner circuit, and an audio signal converter for detecting and low-frequency amplifying a high-frequency amplified signal and for producing an audio signal. A tuning control signal and a volume control signal are respectively supplied from a control unit to the tuning circuit and the audio signal converter circuit of the radio receiver. This control unit is arranged separately from the radio receiver and receives volume control and tuning control operating signals from an operating section which has a tuning control knob, a volume control knob and the like. The operating signals are transmitted to the antenna element and to the radio receiver through the transmission line.

12 Claims, 9 Drawing Figures

RADIO RECEIVER APPARATUS FOR VEHICLE

BACKGROUND OF THE INVENTION

The present invention relates to a radio receiver apparatus mounted in a vehicle such as a passenger car, wherein the reception sensitivity is greatly increased, and the S/N ratio is greatly improved.

In a conventional car radio receiver apparatus mounted in a passenger car, a reception antenna is externally installed on a metal car body, and a radio receiver is installed in the interior of the car and near the driver's seat. The antenna element is connected to the radio receiver through an antenna signal line.

This radio receiver includes a tuner, a detector, and a low-frequency amplifier. A tuner control knob for controlling the tuner and a volume control knob for controlling the amplifier are mounted on the radio receiver housing. The operating mechanisms such as the tuner control knob and the volume control knob are readily accessible to an operator, including the driver.

FIG. 1 schematically shows the overall arrangement of a conventional car radio receiver apparatus of the type described above. A rod-shaped antenna element 11 extends from an external side portion of a hood of the car body or from an external side portion of a rear trunk thereof. A radio receiver 12 is mounted in, for example, a dashboard disposed inside the car. The radio receiver 12 includes a tuner circuit 13 and an audio signal converter 14, the latter of which provides low-frequency amplification of the high-frequency reception signal detected and tuned in by the tuner circuit 13. A control unit 15 supplies a tuner control signal and a volume control signal to the tuner circuit 13 and to the audio signal converter 14, respectively. The control unit 15, in turn, receives operating signals from an operating section 16. In this case, the operating section 16 is disposed at the front panel of the dashboard where the radio receiver 12 is installed.

The tuner circuit 13 of the radio receiver 12 is connected to the antenna element 11 thereof through a coaxial cable 17 which conducts radio signals. Therefore, a radio signal is received by the antenna element 11, is detected and tuned in by the tuner circuit 12, and an amplified signal is then produced by a speaker 18. In this case, a ground circuit for the coaxial cable 17 and the radio receiver 12 is connected to the metal car body and they are thus grounded.

The tuner circuit 13 of the radio receiver 12 comprises a parallel resonant circuit of an inductor L and a variable diode $C_X$, as shown in FIG. 2. The control unit 15 causes the capacitance of the diode $C_X$ to vary in accordance with the operation of the operating section 16, so as to tune in to a desired frequency. In this case, the electromotive force of the reception from the antenna element 11 is transmitted to the tuner circuit 13 through the coaxial cable 17. For this reason, a capacitor $C_C$ is connected in parallel with the variable diode $C_X$. If the capacitor $C_C$ is not present, a tuning frequency $f_T$ of the tuner circuit 13 is given as follows:

$$f_T = \tfrac{1}{2}\pi\sqrt{LC_X}$$

However, since, as described above, the capacitor $C_C$ is connected in parallel with the diode $C_X$, the actual tuning frequency $f_T$ is given as follows:

$$f_T = \tfrac{1}{2}\pi\sqrt{L(C_X + C_C)}$$

The relationships among the inductance of the inductor L, the capacitance C ($= C_X + C_C$), and the tuning frequency $f_T$ are shown in FIG. 3.

In the car radio receiver apparatus of the type described above, the coaxial cable 17 generally has a length of 1 to 3 m, and the capacitance of the capacitor $C_C$ is considerably large. Therefore, the tuning frequency $f_T$ based on the capacitance of the variable diode $C_X$ has a range between a frequency $f_2$ where the capacitance of the diode $C_X$ is "0" and a frequency $f_1$ corresponding to a maximum value of the capacitance of the capacitor $C_C$ by a variation $\Delta C_X$ in the capacitance of the diode $C_X$. Therefore, a desired frequency range cannot correspond to a range between frequencies $f_3$ and $f_4$.

Furthermore, since the capacitor $C_C$ is present, the electromotive force E at the antenna element 11 is absorbed as electrostatic energy of "$\tfrac{1}{2} \cdot C_C \cdot E^2$" and reaches the tuner circuit 13 of the radio receiver 12. As a result, the input signal component is decreased, and optimal reception sensitivity cannot be obtained. In order to improve the reception sensitivity, it is proposed that a high-frequency preamplifying means be arranged ahead of the radio receiver 12. This preamplifying means must cover the entire frequency range of the radio wave signals to be received and must transmit the signals received by the antenna element to the radio receiver 12. More specifically, the highfrequency preamplifying means must cover a frequency band of 0.5 MHz to 110 MHz, which includes a range between a medium wave broadcast frequency and an ultrashort wave broadcast frequency. Furthermore, the frequency band of the signal to be actually received by the radio receiver of the type described above is limited to a narrow frequency band corresponding to the broadcast frequency fd of a radio station to which the receiver 12 is tuned. However, the high-frequency amplifier amplifies a signal having a frequency band considerably wider than the above-mentioned narrow frequency band.

Now assume that a broadcast radio wave is present which has a frequency close to the frequency fd. The nonlinear characteristics of the frequency preamplifying means together with the action of the frequency fd generate a new frequency component. When the frequency of the new signal is increased to have the same frequency as the frequency fd, a loud noise occurs. In order to eliminate the noise described above, the nonlinear characteristics of the high-frequency preamplifying means must be eliminated by a complex circuit. As a result, the circuit arrangement becomes complicated, and the efficiency of the electrical characteristics is degraded.

SUMMARY OF THE INVENTION

It is an object of the present invention to provide a car radio receiver apparatus which allows a tuner circuit to properly tune to a desired broadcast wave signal and which performs proper reception and reproduction of a radio program with high sensitivity.

It is another object of the present invention to provide a car radio receiver apparatus which can stably receive a broadcast radio wave with high sensitivity, irrespective of the intensity of the electrical field of the reception signal, and which can reproduce the broadcast wave signal.

It is still another object of the present invention to provide a car radio receiver apparatus which may be suitably installed in a vehicle such as a passenger car and which reproduces sounds with a high S/N ratio.

According to the car radio receiver apparatus of the present invention, an antenna element installed on a car body is integrally arranged with a tuner circuit of the radio receiver so as to directly connect at least the antenna element and the tuner circuit. Therefore, the capacitance of the coaxial cable between the power source voltage and ground will not influence a resonant circuit which constitutes the tuner circuit. Furthermore, excellent tuning characteristics can be obtained, and reception sensitivity can be effectively improved. In particular, noise such as ignition noise from the engine will not be mixed in with the reception signal.

A broadcast radio wave detector wire is disposed in the car body. The level of the input signal from the antenna element to the tuner circuit is controlled such that a detection output from the wire exceeds a predetermined level. Therefore, optimal radio reception can be performed independent of a strong wave intensity area or a weak wave intensity area, thereby providing effective reception by the radio receiver apparatus while travelling.

DETAILED DESCRIPTION OF THE PREFERRED EMBODIMENTS

Figure 1:
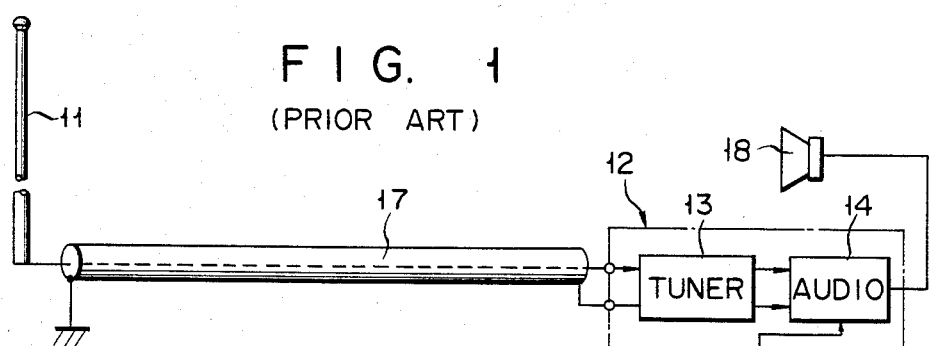
FIG. 1 is a schematic view showing the overall arrangement of a conventional car radio receiver apparatus.
Figure 2:
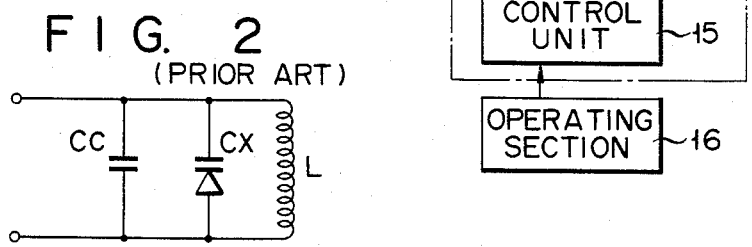
FIG. 2 is a circuit diagram of a circuit equivalent to the tuner circuit used in the radio receiver apparatus shown in FIG. 1.
Figure 3:
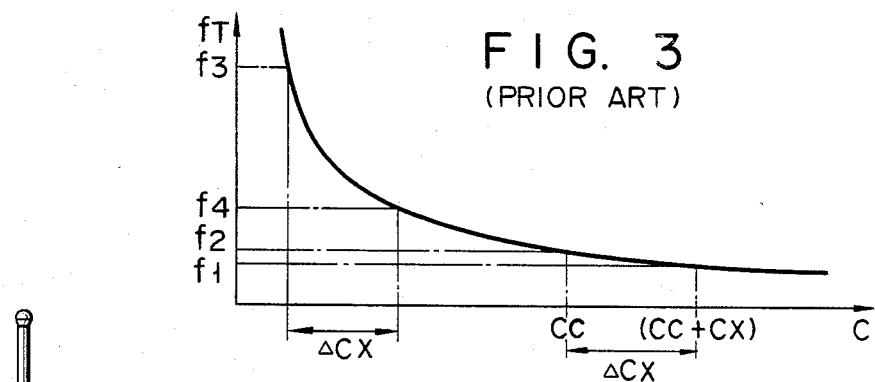
FIG. 3 is a graph for explaining the tuning characteristics of the radio receiver apparatus shown in FIG. 1.
Figure 4:
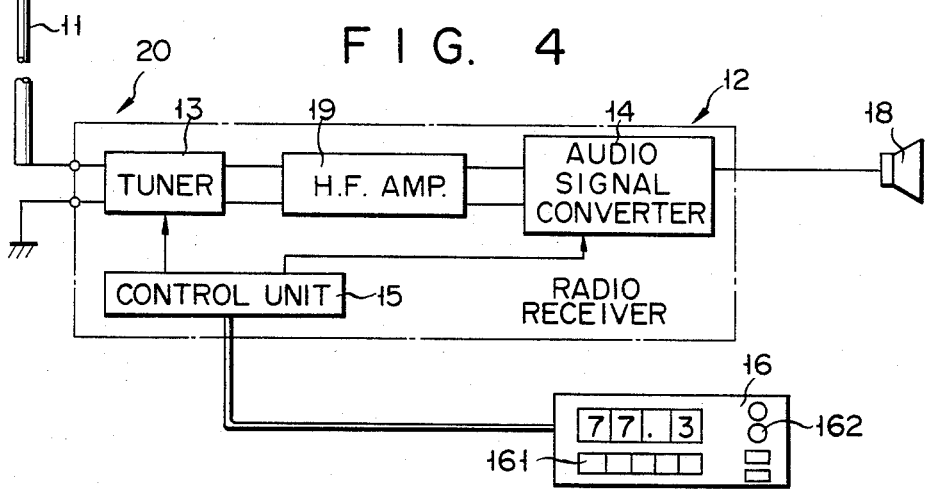
FIG. 4 is a block diagram of a radio receiver apparatus according to a first embodiment of the present invention.

As shown in FIG. 4, in a car radio receiver apparatus, an antenna element 11 is externally mounted on a side portion of a car body, although the installation condition is not illustrated. The antenna element 11 is illustrated in a rod shape. However, the antenna element may be formed by printing a wire pattern on a rear window glass.

The antenna element 11 is directly connected to an input end of a tuner circuit 13 of a radio receiver 12, without using a coaxial cable. The radio receiver 12 comprises a tuner circuit 13 for selecting a desired radio wave signal from the radio wave signals received by the antenna element 11, a high-frequency amplifier circuit 19 for amplifying the reception signal selected by the tuner circuit 13, and an audio signal converter 14 for detecting and low-frequency amplifying the signal which has been previously amplified by the high-frequency amplifier circuit 19 so as to obtain an audio signal. The tuner circuit 13 and the audio signal converter 14 are controlled by control signals from a control unit 15. The control unit 15 supplies a tuner control signal to the tuner circuit 13 which then selects a desired radio wave signal. The control unit 15 also supplies a volume control signal and a tone control signal to the audio signal converter 14. The control unit 15, in turn, receives tuning, volume and tone operating signals from an operating section 16 which is separated from the radio receiver 12. These operating signals and so on correspond to corresponding control knobs and buttons 161, 162, . . . In this manner, the control unit 16 controls the radio reception. The audio signal produced from the audio signal converter 14 on the basis of the reception signal is controlled in accordance with the radio reception control described above, and is supplied to a speaker unit 18. The audio signal is then produced as audible sound by the speaker unit 18.

The radio receiver 12 directly connected to the antenna element 11 is integrally formed with an antenna extension/retraction mechanism when the antenna element 11 comprises a rod-shaped antenna which can be extended/retracted. The radio receiver 12 and the antenna extension/retraction mechanism are mounted in a single casing and constitute a reception section 20.

Figure 5:
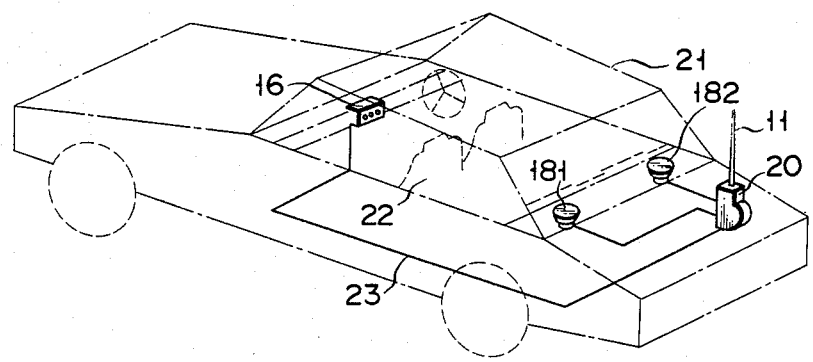
FIG. 5 is a perspective view showing the condition where the radio receiver apparatus shown in FIG. 4 is installed in a vehicle.

As shown in FIG. 5, when the antenna element 11 is installed at the trunk portion of a car body 21, the reception section 20 is fixed inside the trunk. A stereo audio signal from the reception section 20 is supplied to stereo speakers 181 and 182, which are open to the inside of the car, through wires.

The operating section 16 is disposed in the dashboard in front of the driver's seat in a car interior 22. The operating section 16 is connected to the reception section 20 through a transmission line 23 disposed inside the car body 21. The reception section 20 can be easily controlled from the driver's seat.

Figure 6:
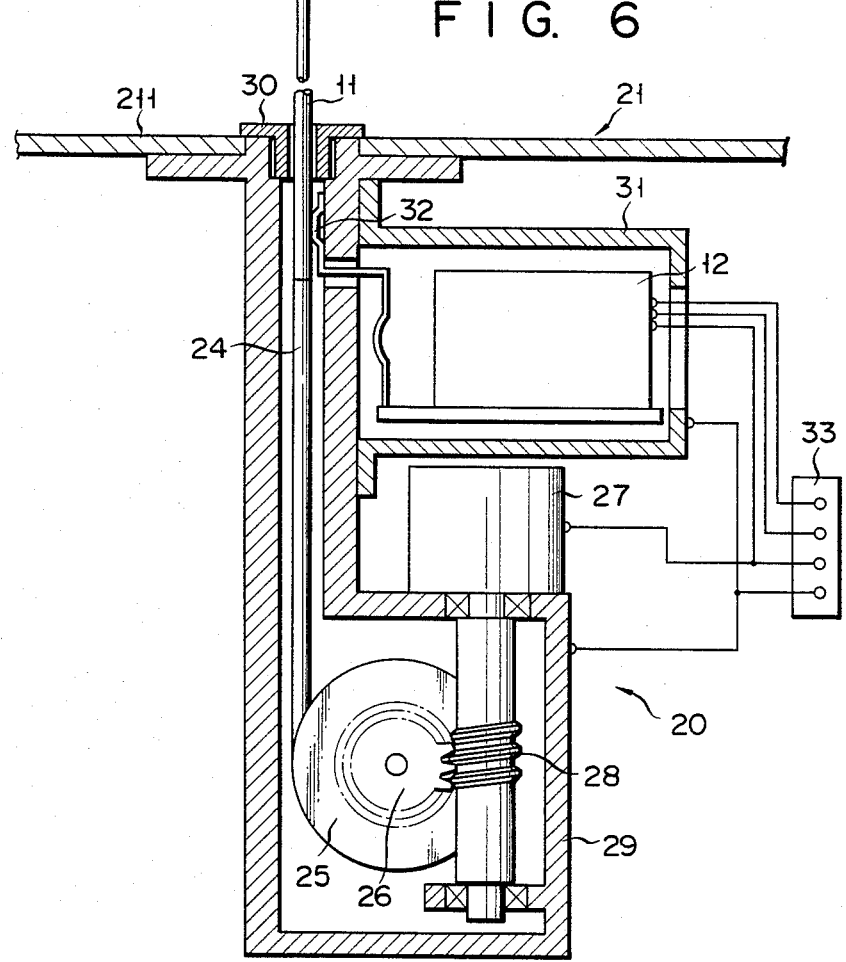
FIG. 6 is a sectional view of a signal reception section including an antenna element shown in FIG. 5.

The reception section 20 disposed in the trunk has a construction as shown in FIG. 6. The antenna element 11 comprises a metal rod, the proximal end of which is attached to one end of a flexible cable 24 made of an insulator such as a plastic material with a given degree of rigidity. Since the flexible cable 24 is wound around a reel 25, the cable 24 is unwound to be extended upward or is wound to be retracted downward upon rotation of the reel 25. In other words, upon rotation of the reel 25, the cable 24 is wound or unwound, so that the antenna element 11 is extended upward or retracted downward.

A gear 26 is concentrically mounted on the reel 25 and meshes with a worm gear 28 rotated by a motor 27. Upon rotation of the motor 27, the antenna element 11 can be extended up from or retracted into the car body. These mechanisms are disposed in a housing 29 which is then fixed by screw nuts 30 located on an outer plate 211 of the car body 21.

A metal casing 31 is integral with the housing 29 and contains the radio receiver 12 therein. A contact piece 32 of an elastic metal which is connected to an input end of the tuner circuit 13 extends from the radio receiver 12. The contact piece 32 is elastically brought into contact with the outer surface of the antenna element 11, so that the electromotive force at the antenna element 11 which corresponds to the received radio wave signal is supplied to the tuner circuit 13 of the receiver 12. An output terminal block 33 is connected to the audio signal converter circuit 14 of the radio receiver 12, to a power source circuit which includes a drive power source for the motor 27, and to a ground circuit. The output terminal block 33 is also connected to the speakers 181 and 182, and to the operating section 16. The power source control of the radio receiver 12 which includes control of the drive power source for the motor 27 has not been described, but this control is performed by the operating section 16.

The electromotive force generated at the antenna element 11 which receives the broadcast wave signals is supplied to the tuner circuit 13 of the radio receiver 12 through the contact piece 32. In this case, the contact piece 32 must be as short as possible and must be electrically insulated from the housing 29, which is grounded, and hence from the metal casing 31. The contact piece 32 is disposed near the housing 29 through an air gap which has a small dielectric constant. Therefore, the electrostatic capacitance of the contact piece 32 can be made as small as possible. As a result, the conventional drawback due to the presence of a coaxial cable is effectively eliminated.

While the vehicle is in motion, the above effect is quite pronounced when the car radio receiver apparatus is used in different areas where radio signals vary in strength.

In the radio receiver apparatus of the type described above, the high-frequency amplifier circuit 19 is arranged to receive the output from the tuner circuit 13. Therefore, the amplifier circuit 19 only amplifies the signal corresponding to the desired reception signal. Even if the nonlinear characteristics are present in the amplifier circuit 19, interference will not occur, thus effectively improving the reception sensitivity.

In the case where the signal corresponding to the desired signal received by the antenna element is supplied to the tuner circuit, the wire is disposed inside the car body and may not receive any other broadcast radio wave which might cause noise. However, noise components from various electrical noise sources within the vehicle (such as ignition noise) are received by the wire, thus degrading the S/N ratio.

However, according to the radio receiver apparatus of the first embodiment of the present invention, the reception signal is converted to an audio signal which has a sufficiently high level, and this audio signal is supplied to the speakers 181 and 182. Therefore, the noise component level induced in the transmission path is significantly smaller than that of the audio signal. As a result, dynamic stereo sounds without background noise are produced by the speakers 181 and 182.

The high-frequency amplifier circuit 19 is arranged in the radio receiver 12, so that the reception sensitivity is greatly improved as previously described. Even if the car is being driven in an area where the reception signal is weak, good radio reception can be performed. However, a car may travel in both a remote area where a radio station is far away (i.e., the reception signal is weak) and also in a downtown urban area where many radio stations are grouped together (i.e., the reception signal is strong). If a high-sensitivity reception level is adopted, the radio receiver is almost prevented from receiving the strong radio waves in the downtown area.

Figure 7:
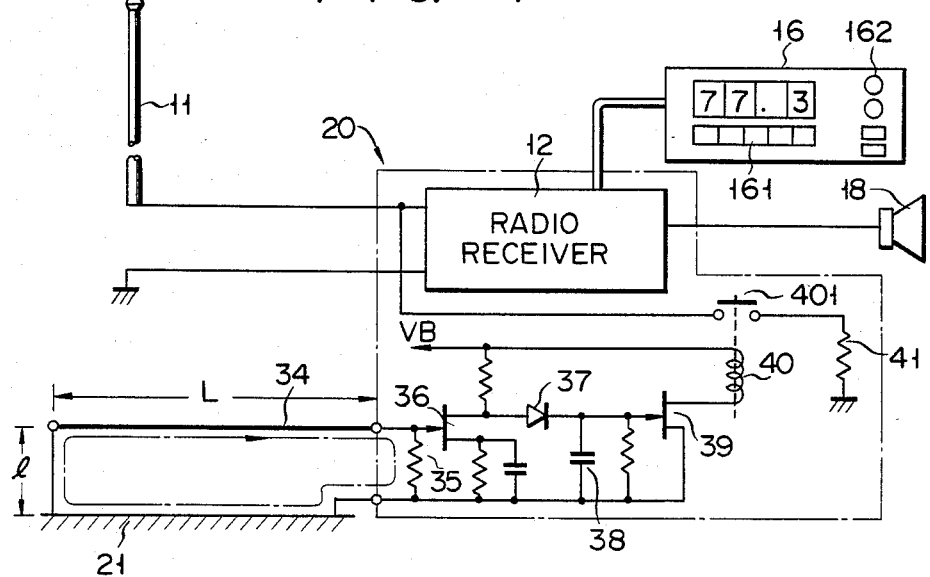
FIG. 7 is a block diagram of a radio receiver apparatus according to a second embodiment of the present invention.
Figure 8:
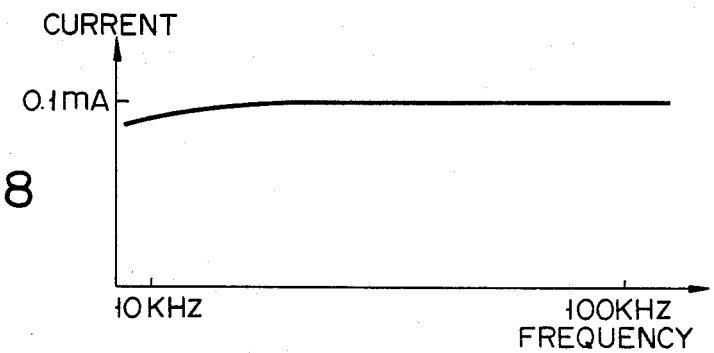
FIG. 8 is a graph for explaining the electric field detection current of the broadcast wave signal in the radio receiver shown in FIG. 7.

FIG. 7 shows a car radio receiver apparatus according to a second embodiment of the present invention, in which optimal reception of the radio waves is performed independently of the relative weakness or strength of the radio waves. A wire 34 having a length L is disposed within the car body and is spaced apart therefrom by a distance l. One end of the wire 34 is grounded through the car body 21, and the other end thereof is connected to the car body 21 through a resistor 35 which has a low resistance R. When an electromotive force is generated by the wire 34 in the radio wave electric field, a voltage signal corresponding to the electromotive force, and hence, to the intensity of the electric field, is obtained by the resistor 35. As shown in FIG. 8, a current I flowing through the wire 34 is not substantially changed, regardless of the frequency, due to the presence of the electric field of the radio wave. Therefore, the strong electric field can be detected by the resistor 35 regardless of the frequency. The results shown in FIG. 8 are obtained by actual measurement under the conditions: $L=1$ m; $l=10$ cm; $R=1$ $\Omega$; and $E=3$ V/m.

The electromotive force of the wire 34 as an electric field detection line, that is, a voltage signal corresponding to a voltage drop at the resistor 35, is amplified by a field effect transistor (FET) 36, is rectified by a diode 37, and charges a capacitor 38. In other words, the rectified signal data is stored in the capacitor 38; the current corresponding to the intensity of the electric field which is currently obtained is stored in the capacitor 38. The terminal voltage of the capacitor 38 is detected by another FET 39. When the intensity of the electric field exceeds a predetermined level, an excitation current flows through a relay coil 40 to close a relay switch 401. The relay switch 401 is connected to the input end of a radio receiver 12. When the relay switch 401 is closed, the input end of the radio receiver 12 is grounded through the relay switch 401 and a resistor 41. The electromotive force supplied from an antenna element 11 to the tuner circuit of the radio receiver 12 is lowered by the resistor 41, so that the electromotive force supplied to the radio receiver 12 is limited to effectively perform tuning.

When the radio station to be received is at a considerable distance from the radio receiver 12, that is, when the electric field has a low intensity, power induced at the wire 34 is not large enough to turn on the FET 39. The relay switch 401 is kept open. Therefore, the electromotive force induced at the antenna element 11 which receives the radio wave is effectively supplied to the radio receiver 12 at a sufficiently high sensitivity.

However, when many radio stations are in the vicinity of the radio receiver 12, that is, when the electric field has a high intensity, the electromotive force at the wire 34 is great enough to cause a large voltage drop at the resistor 35. The storage voltage of the capacitor 38 increases, so that the relay switch 401 is closed. Therefore, even in a strong reception area, the input current from the antenna to the radio receiver 12 is limited. As a result, mutual modulation effects in the radio receiver 12 may not occur. The radio receiver 12 is thus tuned in to a desired station and provides high-quality sound reproduction without noise.

When the high intensity of the electric field of the wire 34 is detected, power need not be limited, so that the high-frequency voltage induced by the high intensity of the electric field is only rectified and is stored in the capacitor.

Figure 9:
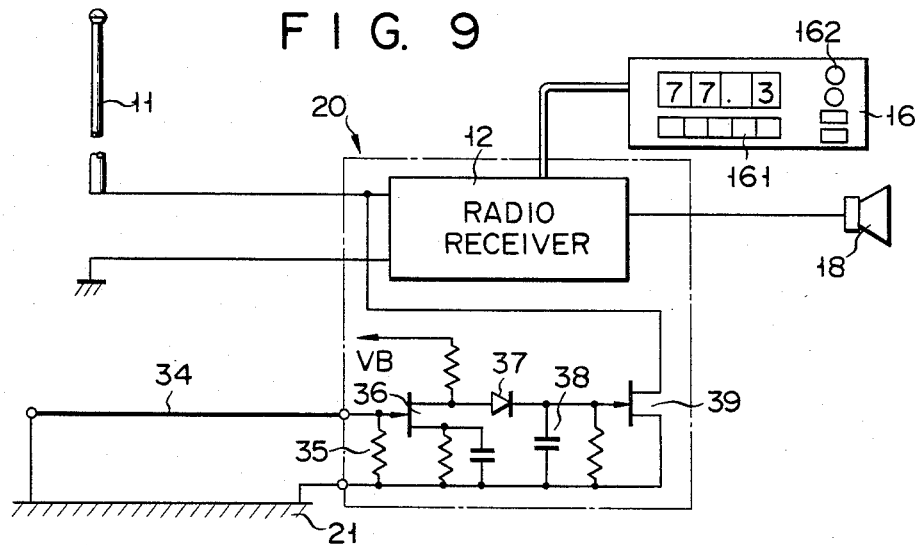
FIG. 9 is a block diagram of a radio receiver apparatus according to a third embodiment of the present invention.

In the second embodiment of the present invention described above, the intensity of the electric field formed by the radio waves is classified into weak and strong intensities, incorporating the switching operation of the relay switch 401. The input end of the radio receiver 12 may be grounded through an impedance between the source and drain of the FET 39, as shown in FIG. 9, in which the same reference numerals denote the same parts as in FIG. 7. This is achieved based on the fact that the impedance between the source and drain of the FET 39 is decreased when the gate input voltage, that is, the terminal voltage at the capacitor, is increased. In brief, the input end of the radio receiver 12 is continuously controlled in accordance with the intensity of the electric field.

In the above embodiment, the radio receiver 20 comprises the tuner circuit 13, the high-frequency amplifier circuit 19 and the audio signal converter 14. However, the radio receiver 20 may include only the tuner circuit 13; or only the tuner circuit 13 and the high-frequency amplifier circuit 19; or the tuner circuit 13, the high-frequency amplifier circuit 19 and the detection stage. If an electromotive force of low level from the antenna element is supplied to the tuner circuit 13 without passing through a coaxial cable, the effect of the present invention is sufficiently achieved. When only the amplifier means for producing the audio signal is integral with the operating section 16, such an assembly can also be effectively used as the amplifier for a tape recorder or the like.

One aspect, namely the detected current of the electric field (of the wire 34 in the embodiments shown in FIGS. 7 and 9) shown in FIG. 8, does not vary in accordance with the shape and direction of the closed loop of the wire 34, but varies only in accordance with the size thereof. Therefore, the position and direction of the wire of the closed loop need not be considered in circuit design.

What is claimed is:

1. A radio receiver apparatus for a vehicle having a passenger compartment that comprises:
an antenna device for receiving signals;
a means for tuning said received signals;
said antenna device and said tuning means being formed as an integral unit for being mounted in a vehicle location separate from said passenger compartment;
a metallic contact member for transmitting said received signals to said tuning means;
a means, structurally separate from said integral unit, for being mounted within said passenger compartment, for remotely controlling said tuning means; and
a speaker system, structurally separate from said control means, for producing audible signals in said passenger compartment related to broadcast waves tuned by said means for tuning.

2. A radio receiver apparatus for use in automobiles as claimed in claim 1 further comprising a means for extending or retracting said antenna; said means for extending or retracting being also controlled by said means for remotely controlling said tuning means.

3. A radio receiver apparatus for a vehicle, comprising:
an antenna device, having a projectable antenna element for receiving broadcast waves, attached to said vehicle in a position separate from a passenger compartment thereof;
a radio receiver, coupled to said vehicle adjacent to said antenna device, including a tuning circuit having an input terminal;
a connecting member for connecting said input terminal to said antenna device;
an operating section, provided inside the passenger compartment, for sending operation control signals, which include tuning control signals, to said radio receiver;
a transmission line, connected between said separated radio receiver and said operating section, for carrying the control signals to said radio receiver thereby controlling said radio receiver;
a field detection wire, provided inside the vehicle, for generating a field detection signal having a level corresponding to the strength of a broadcast wave field; and
means, responsive to said field detection signals, for reducing the level of a signal from said antenna element, which is coupled to said radio receiver.

4. An apparatus according to claim 3, wherein said radio receiver includes an audio signal converter for detecting a signal tuned into by said tuning circuit and for amplifying a detected signal.

5. An apparatus according to claim 3, wherein said radio receiver includes a high-frequency amplifier circuit which receives an output signal from said tuning circuit and high-frequency amplifies only a signal tuned by said tuning circuit.

6. An apparatus according to claim 3, wherein said antenna device comprises a rod-shaped antenna element, a drive mechanism for extending said antenna element; said apparatus including a first housing containing said drive mechanism; a second housing containing said radio receiver, said first and said second housing being attached together so that a single unit is formed.

7. An apparatus according to claim 6, wherein a contact member of elastic material is attached to an antenna input terminal section of said radio receiver, said contact member passing through a gap between said first and said second housings, and contacting the periphery of said antenna element.

8. An apparatus according to claim 6, wherein said reducing means includes a variable impedance element, said impedance element controlling the impedance in response to said field detection signal, and which reduces the tuning circuit input signal of said radio receiver.

9. An apparatus according to claim 8, wherein said variable impedance element comprises a field effect transistor.

10. An apparatus according to claim 3, wherein one end of said field detection wire is connected to the vehicle body and the other end is connected to the vehicle body in a closed loop via a resistor so that said field detection signal level corresponds to a voltage across said resistor.

11. An apparatus according to claim 3, wherein said reducing means comprises a switching device responsive to said field detection signal, a relay device actuated by said switching device, and a grounding circuit, the input of said tuning circuit being connected to said grounding circuit upon actuation of said relay.

12. A radio receiver apparatus for an automotive vehicle having a vehicle body and a passenger compartment comprising:
a radio receiver including a tuning circuit and a control unit for operating said tuning circuit in response to command tuning signals coupled thereto;
an antenna for receiving a broadcast signal including a means for extending or retracting said antenna and a metallic telescopic rod;
said means for extending or retracting said antenna including,
 a flexible dielectric cable of a predetermined rigidity, being mounted on an end of said rod,
 a reel having said cable wound around said reel,
 a first gear mounted to said reel,
 a second gear meshing to said first gear,
 a motor driving said second gear so that upon actuation of said motor, said metallic rod is extended upward or downward;
a first housing containing said receiver;
a second housing for containing said antenna said first and second housings forming a single unit; said housings having a common aperature;
an elastic metal contact member connecting said antenna to said receiver through said aperture;
a broadcast wavefield detection wire, coupled to said vehicle body, having a resistor interposed serially therewith so that a voltage portional to a broadcast wavefield is developed across said resistor;
means for reducing the strength of said received broadcast signal delivered to said tuning circuit, said means being actuated when a predetermined voltage level is present at said resistor;
an operating control unit mounted within said passenger compartment for generating said command tuning signals and for extending or retracting said antenna;
means for coupling said command signals to said receiver and said extending/retracting means thereby remotely controlling same.

* * * * *